(12) United States Patent
Trinh et al.

(10) Patent No.: US 10,910,560 B2
(45) Date of Patent: Feb. 2, 2021

(54) RRAM STRUCTURE

(71) Applicant: Taiwan Semiconductor Manufacturing Co., Ltd., Hsin-Chu (TW)

(72) Inventors: Hai-Dang Trinh, Hsinchu (TW); Chii-Ming Wu, Taipei (TW); Hsing-Lien Lin, Hsin-Chu (TW); Fa-Shen Jiang, Taoyuan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/232,342

(22) Filed: Dec. 26, 2018

(65) Prior Publication Data

US 2020/0098985 A1    Mar. 26, 2020

Related U.S. Application Data

(60) Provisional application No. 62/734,575, filed on Sep. 21, 2018.

(51) Int. Cl.
  *H01L 45/00* (2006.01)
  *H01L 27/24* (2006.01)
  *H01L 23/528* (2006.01)

(52) U.S. Cl.
  CPC ........ *H01L 45/1253* (2013.01); *H01L 23/528* (2013.01); *H01L 27/2436* (2013.01); *H01L 45/08* (2013.01); *H01L 45/1233* (2013.01); *H01L 45/146* (2013.01); *H01L 45/147* (2013.01); *H01L 45/1608* (2013.01)

(58) Field of Classification Search
  CPC ..... H01L 45/12; H01L 45/146; H01L 45/147; H01L 45/1253; H01L 45/1233; H01L 45/1608; H01L 45/00; H01L 45/08; H01L 45/14; H01L 45/145; H01L 45/16; H01L 45/085; H01L 45/1266; H01L 45/1273; H01L 45/1691; H01L 27/24; H01L 27/24249
  USPC ........................................................... 257/4
  See application file for complete search history.

(56) References Cited

U.S. PATENT DOCUMENTS

| | | | |
|---|---|---|---|
| 6,190,963 B1 | 2/2001 | Zhang et al. | |
| 6,407,422 B1 | 6/2002 | Asano et al. | |
| 9,806,255 B1 | 10/2017 | Hsu et al. | |
| 9,954,166 B1 | 4/2018 | Lin et al. | |
| 10,043,705 B2 | 8/2018 | Chu et al. | |
| 10,193,065 B2 | 1/2019 | Dang et al. | |
| 2011/0291066 A1 | 12/2011 | Baek et al. | |
| 2014/0061568 A1 | 3/2014 | Ramaswamy et al. | |

(Continued)

OTHER PUBLICATIONS

Wong, et al. "Metal-Oxide RRAM." Proceedings of the IEEE, vol. 100, No. 6, Jun. 2012.
U.S. Appl. No. 15/939,864, filed Mar. 29, 2018.

*Primary Examiner* — Chuong A Luu
(74) *Attorney, Agent, or Firm* — Eschweiler & Potashnik, LLC

(57) ABSTRACT

In some embodiments, the present disclosure relates to an integrated chip. The integrated chip includes a bottom electrode disposed over one or more interconnect layers and a diffusion barrier layer is arranged over the bottom electrode. A data storage layer is separated from the bottom electrode by the diffusion barrier layer. A top electrode is over the data storage layer.

20 Claims, 11 Drawing Sheets

(56) References Cited

U.S. PATENT DOCUMENTS

| | | |
|---|---|---|
| 2014/0192589 A1 | 7/2014 | Maxwell et al. |
| 2017/0141300 A1* | 5/2017 | Trinh .................. H01L 45/1233 |
| 2017/0141305 A1* | 5/2017 | Yang .................. H01L 45/1253 |
| 2017/0207387 A1 | 7/2017 | Yang et al. |
| 2018/0145253 A1 | 5/2018 | Zhou et al. |
| 2018/0233665 A1 | 8/2018 | Chen et al. |
| 2018/0269389 A1 | 9/2018 | Hsu et al. |
| 2019/0305218 A1* | 10/2019 | Trinh .................. H01L 45/144 |

* cited by examiner down# RRAM STRUCTURE

REFERENCE TO RELATED APPLICATION

This Application claims the benefit of U.S. Provisional Application No. 62/734,575, filed on Sep. 21, 2018, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random-access memory (RRAM) devices are one promising candidate for a next generation non-volatile memory technology. This is because RRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
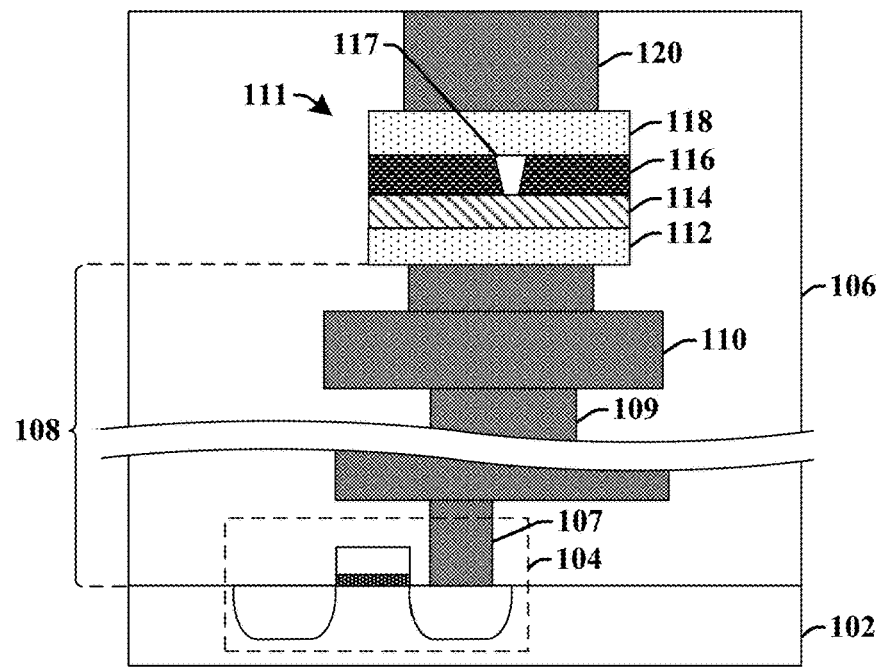
FIG. 1 illustrates a cross-sectional view of some embodiments of an integrated chip having a disclosed resistive random-access memory (RRAM) device comprising a diffusion barrier layer disposed between a bottom electrode and a data storage layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices generally comprise a data storage layer (e.g., a layer of high-k dielectric material) arranged between conductive bottom and top electrodes disposed within a back-end-of-the-line (BEOL) metallization stack. RRAM devices are configured to operate based upon a process of reversible switching between resistive states. This reversible switching is enabled by selectively forming a conductive filament through the data storage layer. For example, the data storage layer, which is normally insulating, can be made to conduct by applying a voltage across the conductive electrodes to form a conductive filament extending through the data storage layer. An RRAM device having a first (e.g., high) resistive state corresponds to a first data value (e.g., a logical '0') and an RRAM device having a second (e.g., low) resistive state corresponds to a second data value (e.g., a logical '1').

To improve a reliability of an RRAM device, the bottom electrode of an RRAM device may comprise a noble metal (i.e., an inert metal). Because a noble metal has a low reactivity, the use of a noble metal in the bottom electrode of the RRAM device may prevent degradation of the bottom electrode due to interactions with ions (e.g., oxygen ions) from an overlying data storage layer. However, it has been appreciated that metal atoms from a noble metal can diffuse into an overlying data storage layer during high temperature processes used during the fabrication of overlying layers of an RRAM device. The diffusion of noble metal atoms from the bottom electrode forms hillocks (i.e., protrusions) along a top of the bottom electrode. The hillocks comprise a combination of the noble metal atoms and the data storage layer (e.g., hafnium titanium oxide). The hillocks extend into the data storage layer, thereby effectively thinning the data storage layer and leading to a reduced reliability of the resulting RRAM device and/or leakage between the bottom and top electrodes of the resulting RRAM device.

The present disclosure, in some embodiments, relates to an RRAM device comprising a bottom electrode separated from a top electrode by a data storage layer. A diffusion barrier layer is arranged between the bottom electrode and the data storage layer. The diffusion barrier layer is configured to prevent the diffusion of metal atoms (e.g., noble metal atoms) from the bottom electrode into the data storage layer and to thereby prevent the formation of hillocks within the data storage layer. Preventing the diffusion of metal atoms from the bottom electrode into the data storage layer, allows for the data storage layer to have a substantially uniform thickness that increases a reliability of the RRAM device.

FIG. 1 illustrates a cross-sectional view of some embodiments of an integrated chip 100 comprising a resistive random-access memory (RRAM) device having a diffusion barrier layer disposed between a bottom electrode and a data storage layer.

The integrated chip 100 comprises an RRAM device 111 disposed within a dielectric structure 106 over a substrate 102. The RRAM device 111 is separated from the substrate 102 by one or more lower interconnect layers 108 disposed within the dielectric structure 106. In some embodiments, the one or more lower interconnect layers 108 may comprise conductive contacts 107 coupled to overlying and alternating layers of interconnect vias 109 and interconnect wires 110. The one or more lower interconnect layers 108 are configured to couple the RRAM device 111 to an access transistor 104 arranged within the substrate 102.

The RRAM device 111 comprises a dielectric data storage layer 116 arranged between a bottom electrode 112 and a top electrode 118. The bottom electrode 112 is coupled to the one or more lower interconnect layers 108 and the top electrode 118 is coupled to an upper interconnect structure 120 comprising an interconnect wire or via. The dielectric data storage layer 116 is configured to store data states by undergoing reversible changes between a high resistive state associated with a first data state (e.g., a '0') and a low resistive state associated with a second data state (e.g., a '1'). For example, during operation, to achieve a low resistive state within the dielectric data storage layer 116, a first set of bias conditions may be applied to the bottom electrode 112 and the top electrode 118. The first set of bias conditions drive oxygen from dielectric data storage layer 116 to the top electrode 118, thereby forming a conductive filament 117 of oxygen vacancies across the dielectric data storage layer 116. Alternatively, to achieve a high resistive state within the dielectric data storage layer 116, a second set of bias conditions may be applied to the bottom electrode 112 and the top electrode 118. The second set of bias conditions break the conductive filament 117 by driving oxygen from the top electrode 118 to the dielectric data storage layer 116.

A diffusion barrier layer 114 is arranged between the bottom electrode 112 and the dielectric data storage layer 116. The diffusion barrier layer 114 is configured to prevent the diffusion of metal atoms (e.g., noble metal atoms) from the bottom electrode 112 towards the dielectric data storage layer 116. By preventing the diffusion of metal atoms from the bottom electrode 112 towards the dielectric data storage layer 116, hillocks comprising the metal atoms are prevented from forming along a top of the bottom electrode 112. By preventing the formation of hillocks along the top of the bottom electrode 112, a uniformity of a thickness of the dielectric data storage layer 116 is improved, thereby improving performance and/or reliability of the RRAM device 111. The diffusion barrier layer 114 also improves a variation in thicknesses of dielectric data storage layers between RRAM cells, thereby improving cell-to-cell variation and die yield.

Figure 2:
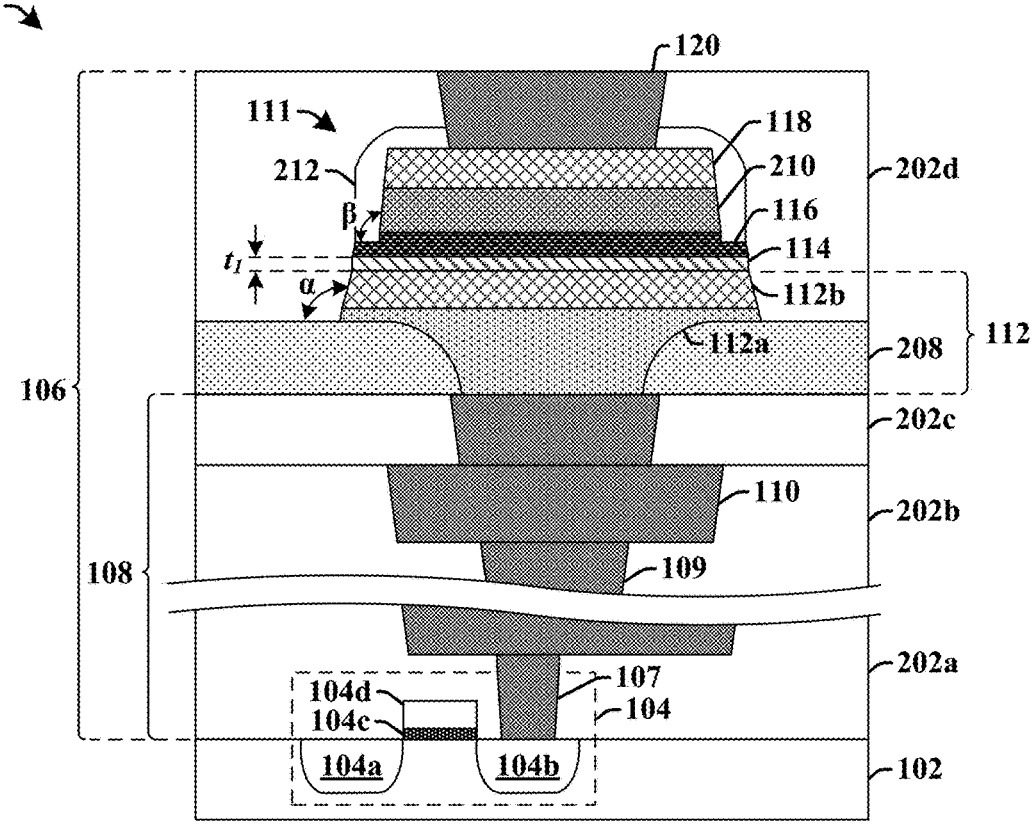
FIG. 2 illustrates a cross-sectional view of some additional embodiments of an integrated chip having a disclosed RRAM device comprising a diffusion barrier layer.

FIG. 2 illustrates an additional embodiment of a cross-sectional view of an integrated chip 200 having an RRAM device.

The integrated chip 200 comprises an RRAM device 111 disposed within a dielectric structure 106 arranged over a substrate 102. In some embodiments, the dielectric structure 106 comprises a plurality of stacked inter-level dielectric (ILD) layers 202a-202d. The plurality of stacked ILD layers 202a-202d laterally surround one or more lower interconnect layers 108 comprising interconnect vias 109 and interconnect wires 110. The one or more lower interconnect layers 108 are configured to couple the RRAM device 111 to an access transistor 104 arranged within the substrate 102. In some embodiments, the access transistor 104 may comprise a MOSFET device having a gate electrode 104d that is arranged between a source region 104a and a drain region 104b and that is separated from the substrate 102 by a gate dielectric 104c.

The RRAM device 111 comprises a dielectric data storage layer 116 arranged between a bottom electrode 112 and a top electrode 118. The bottom electrode 112 is arranged over the one or more lower interconnect layers 108 and is laterally surrounded by a lower insulating layer 208. In various embodiments, the lower insulating layer 208 may comprise silicon nitride, silicon dioxide, silicon carbide, or the like. In some embodiments, the dielectric data storage layer 116 may have a bottom surface having a first width and a top surface having a second width that is less than the first width. In such embodiments, the dielectric data storage layer 116 may have a lower sidewall coupled to an upper sidewall by a horizontally extending surface that overlies the dielectric data storage layer 116. In some embodiments, the dielectric data storage layer 116 may have a thickness in a range of between approximately 30 Angstroms and approximately 100 Angstroms. In other embodiments, the dielectric data storage layer 116 may have a thickness in a range of between approximately 25 Angstroms and approximately 75 Angstroms. In some embodiments, the top electrode 118 may have a thickness in a range of between approximately 50 Angstroms and approximately 200 Angstroms.

In some embodiments, the bottom electrode 112 may have a bottom electrode diffusion barrier 112a and a bottom electrode metal 112b arranged over the bottom electrode diffusion barrier 112a. The bottom electrode diffusion barrier 112a is laterally surrounded by the lower insulating layer 208. The bottom electrode diffusion barrier 112a fills an opening defined by sidewalls of the lower insulating layer 208. In some embodiments, the bottom electrode diffusion barrier 112a may extend from within the opening to over the lower insulating layer 208. In such embodiments, the bottom electrode diffusion barrier 112a may have a first thickness between the sidewalls of the lower insulating layer 208 and a smaller second thickness over the lower insulating layer 208. In some embodiments, the first thickness may be in a range of between approximately 200 Angstroms and approximately 400 Angstroms. In some embodiments, the bottom electrode metal 112b may have a thickness in a range of between approximately 50 Angstroms and approximately 300 Angstroms. In some embodiments, the bottom electrode diffusion barrier 112a barrier has a curved lower sidewall surrounded by the lower insulating layer 208 and a substantially flat upper sidewall over the lower insulating layer 208. In some embodiments, the bottom electrode diffusion barrier 112a may have a substantially flat upper surface.

In some embodiments, the bottom electrode metal 112b may comprise a first conductive material and the bottom electrode diffusion barrier 112a and the top electrode 118 may comprise one or more conductive materials that are different than the first conductive material. For example, in some embodiments, the bottom electrode metal 112b may comprise a noble metal, such as platinum, ruthenium, iridium, gold, or the like. The noble metal provides the RRAM device 111 with good endurance and data retention. This is because the noble metal has a low reactivity with ions (e.g., oxygen ions), and thus can help to prevent the permeability of oxygen ions into the bottom electrode 112 during RRAM cycling. The bottom electrode diffusion barrier 112a and the top electrode 118 may comprise a metal, such as titanium, titanium nitride, tantalum, tantalum nitride, tungsten, tungsten nitride, or the like. In some embodiments, the bottom electrode diffusion barrier 112a and the top electrode 118 may comprise a same material.

A diffusion barrier layer 114 is arranged between the bottom electrode 112 and a dielectric data storage layer 116. The diffusion barrier layer 114 is vertically separated from the bottom electrode diffusion barrier 112a by way of the bottom electrode metal 112b. In some embodiments, the diffusion barrier layer 114 contacts the bottom electrode metal 112b along a substantially flat interface. The diffusion barrier layer 114 may comprise a different material than the bottom electrode metal 112b. In some embodiments, the diffusion barrier layer 114 may comprise tantalum nitride, titanium nitride, titanium carbon nitride, tungsten nitride, or the like. In other embodiments, the diffusion barrier layer 114 may comprise a noble metal oxide (e.g., ruthenium oxide, iridium oxide, rhodium oxide, or the like) or a noble metal nitride (e.g., ruthenium nitride, iridium nitride, or the like).

The diffusion barrier layer 114 has a thickness $t_1$ that is sufficient to prevent the formation of hillocks comprising metal atoms (e.g., noble metal atoms) of the bottom electrode 112 from extending into the dielectric data storage layer 116. In some embodiments, the thickness $t_1$ is in a range of between approximately 5 Angstroms and approximately 30 Angstroms. A thickness of the diffusion barrier layer 114 that is less than 5 Angstroms may be unable to effectively prevent diffusion of metal atoms from the bottom electrode metal 112b in a reliable manner, while a thickness of the diffusion barrier layer 114 that is greater than 30 Angstroms may interfere with performance of the RRAM device 111 by mitigating the advantages using a noble metal within the bottom electrode 112. In other embodiments, the thickness $t_1$ may have different thicknesses.

A capping layer 210 is arranged between the dielectric data storage layer 116 and the top electrode 118. The capping layer 210 is configured to store oxygen, which can facilitate resistive changes within the dielectric data storage layer 116. In various embodiments, the capping layer 210 may comprise hafnium, titanium, tantalum, aluminum, zirconium, or the like. In some embodiments, the capping layer 210 may have a thickness in a range of between approximately 70 Angstroms and approximately 200 Angstroms. In some embodiments, a dielectric spacer 212 may be arranged along sidewalls of the capping layer 210 and the top electrode 118. In some embodiments, the dielectric spacer 212 may also be arranged along a sidewall of the dielectric data storage layer 116. In some embodiments, the dielectric spacer 212 may be arranged on a horizontally extending surface of the top electrode 118 and/or the dielectric data storage layer 116. In some embodiments, the dielectric spacer 212 may comprise a nitride (e.g., silicon nitride), an oxide (e.g., silicon oxide), a carbide (e.g., silicon carbide), or the like.

In some embodiments, sidewalls of the diffusion barrier layer 114 may be angled at a first angle α with respect to an upper surface of the lower insulating layer 208. The first angle α may be greater than 90°. In some embodiments, the sidewalls of the diffusion barrier layer 114 may be aligned along a line with sidewalls of the bottom electrode 112 and the dielectric data storage layer 116. In some embodiments, the sidewalls of the capping layer 210 may be angled at a second angle β with respect to an upper surface of the dielectric data storage layer 116. The second angle β may also be greater than 90°. In some embodiments, the first angle α is different (e.g., greater than) the second angle β.

Figure 3A:
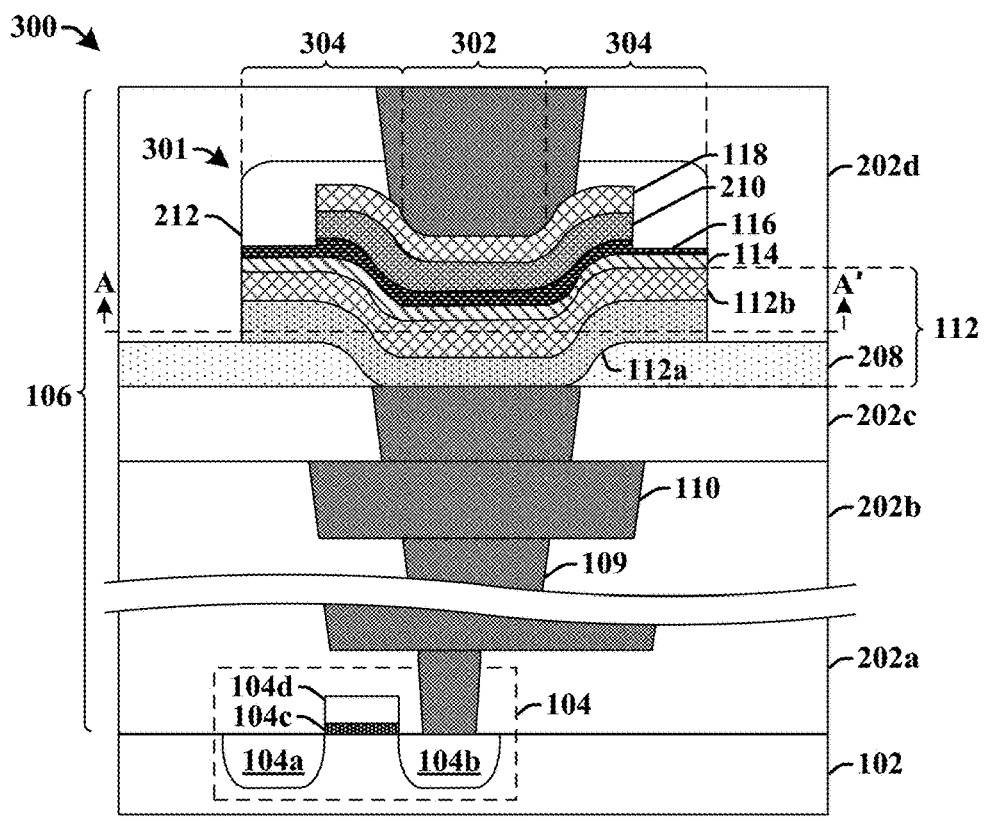
FIGS. 3A-3B illustrate some additional embodiments of an integrated chip having a disclosed RRAM device comprising a diffusion barrier layer.

FIG. 3A illustrates a cross-sectional view of an additional embodiment of an integrated chip 300 having an RRAM device.

The integrated chip 300 comprises an RRAM device 301 arranged over a substrate 102. The RRAM device 301 comprises a dielectric data storage layer 116 arranged between a bottom electrode 112 and a top electrode 118. The bottom electrode 112 comprises a bottom electrode diffusion barrier 112a and a bottom electrode metal 112b over the bottom electrode diffusion barrier 112a. A capping layer 210 may be arranged between the dielectric data storage layer 116 and the top electrode 118.

Figure 3B:
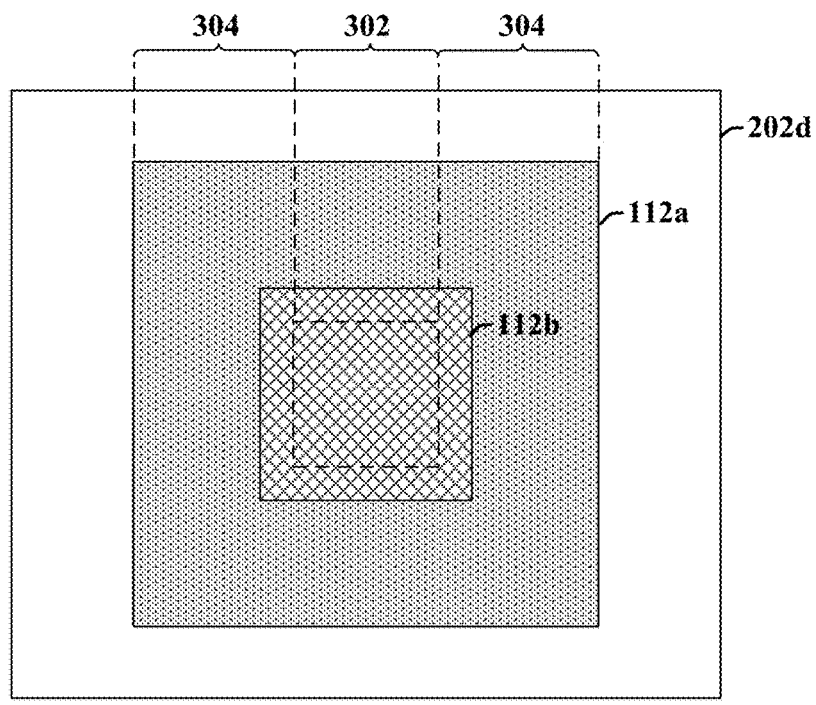

The bottom electrode diffusion barrier 112a, the bottom electrode metal 112b, the dielectric data storage layer 116, the capping layer 210, and the top electrode 118 respectively have an inner region 302 laterally surrounded by an outer region 304. The inner region 302 has a recessed upper surface arranged laterally between and vertically below upper surfaces of the outer region 304. As shown in top-view 306 of FIG. 3B, the outer region 304 of the bottom electrode diffusion barrier 112a extends along an outermost perimeter of the bottom electrode diffusion barrier 112a. In some embodiments, the outer region 304 may continually extend in an unbroken ring around the inner region 302.

In some embodiments, the bottom electrode diffusion barrier 112a, the bottom electrode metal 112b, the diffusion barrier layer 114, the capping layer 210, and the top electrode 118 may respectively has a substantially equal thickness between outermost sidewalls. For example, the bottom electrode diffusion barrier 112a may have a substantially equal thickness in a range of between approximately 30 Angstroms and approximately 200 Angstroms. In some embodiments, the inner region 302 of the dielectric data storage layer 116 may have a first thickness and the outer region of the dielectric data storage layer 116 may have a second thickness that is less than the first thickness.

Figure 4A:
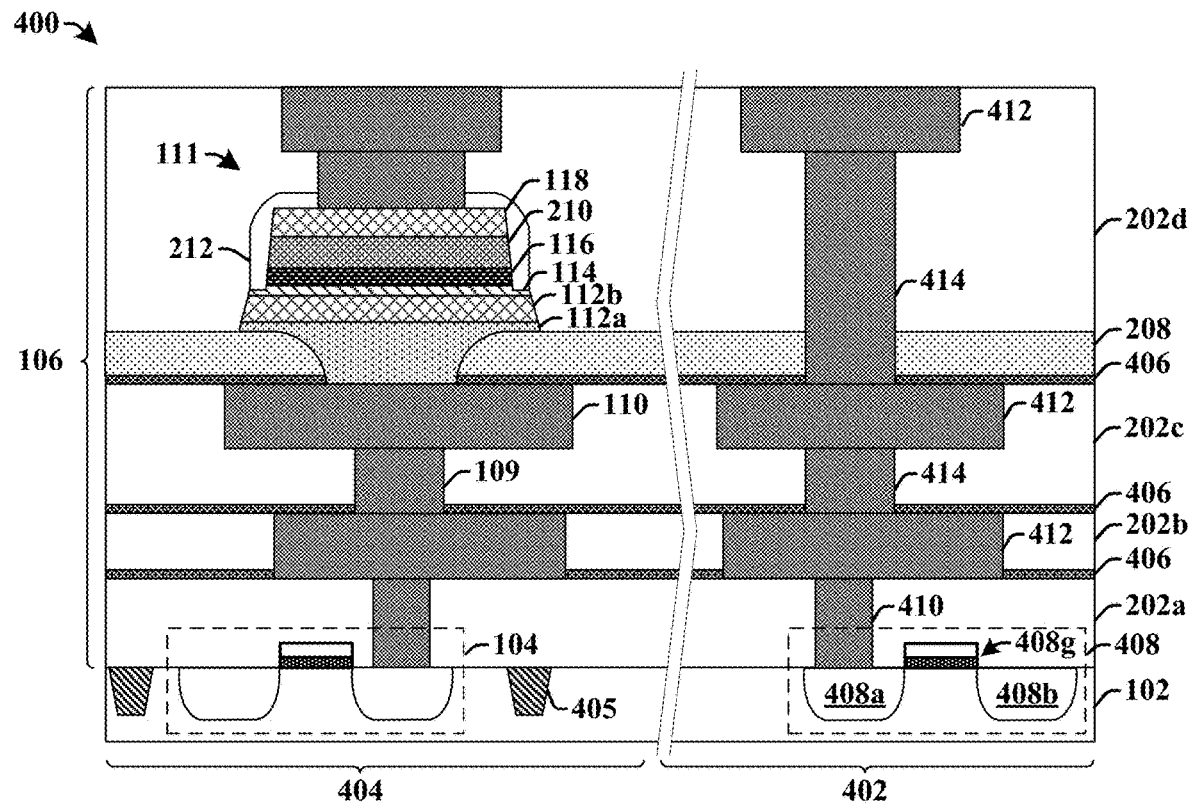
FIGS. 4A-4B illustrate some additional embodiments of an integrated chip having an embedded RRAM device comprising a diffusion barrier layer disposed between a bottom electrode and a data storage layer.

FIG. 4A illustrates a cross-sectional view of some additional embodiments of an integrated chip 400 having an RRAM device.

Figure 4B:
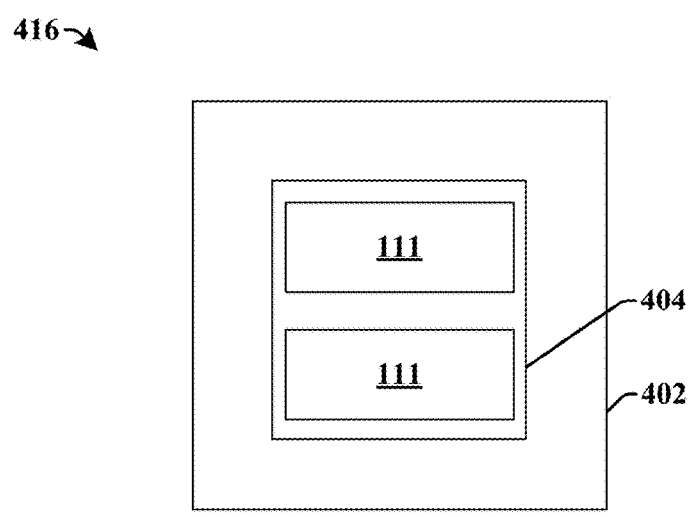

The integrated chip 400 comprises a substrate 102 including a logic region 402 and an embedded memory region 404. As shown in top-view 416 of FIG. 4B, in some embodiments, the logic region 402 may surround the embedded memory region 404.

Referring to FIG. 4A, a dielectric structure 106 is arranged over the substrate 102. The dielectric structure 106 comprises a plurality of stacked ILD layers 202a-202d separated by etch stop layers 406. In some embodiments, the plurality of stacked ILD layers 202a-202d may comprise one or more of an oxide layer, a low-k dielectric layer, an ultra low-k dielectric layer, or the like. In some embodiments, the etch stop layers 406 may comprise a nitride (e.g., silicon nitride), a carbide (e.g., silicon carbide), or the like.

The logic region 402 comprises a transistor device 408 arranged within the substrate 102. The transistor device 408 comprises a source region 408a, a drain region 408b separated from the source region 408a by a channel region, and a gate structure 408g over the channel region. In some embodiments, the transistor device 408 may comprise a high-k metal gate (HKMG) transistor. In such embodiments, the gate structure 408g may comprise a metal gate electrode (e.g., comprising aluminum, ruthenium, palladium, or the like) and a gate dielectric comprising a high-k dielectric (e.g., comprising aluminum oxide, hafnium oxide, or the like). In other embodiments, the gate structure 408g may comprise a polysilicon gate electrode and a gate dielectric comprising an oxide (e.g., silicon dioxide).

The source region 408a is coupled to a plurality of interconnect layers surrounded by the dielectric structure 106. The plurality of interconnect layers comprise conductive contacts 410, interconnect wires 412, and interconnect vias 414. In some embodiments, the plurality of interconnect layers may comprise copper, tungsten, aluminum, and/or the like.

The embedded memory region 404 comprises an access transistor 104 arranged within the substrate 102. The access transistor 104 is coupled to an RRAM device 111. The RRAM device 111 is arranged along a horizontal plane that intersects one of the interconnect vias 414 within the logic region 402. In some embodiments, one or more isolation structures 405 may be arranged within the substrate 102 on opposing sides of the access transistor 104. The isolation structures 405 may comprise one or more dielectric materials arranged within trenches defined by interior surfaces of the substrate 102. In some embodiments, the isolation structures 405 may comprise shallow trench isolation (STI) structures. In some such embodiments, the isolation structures 405 may comprise a same isolation structure continuously extending in a closed loop around a perimeter of the access transistor 104.

Figure 5:
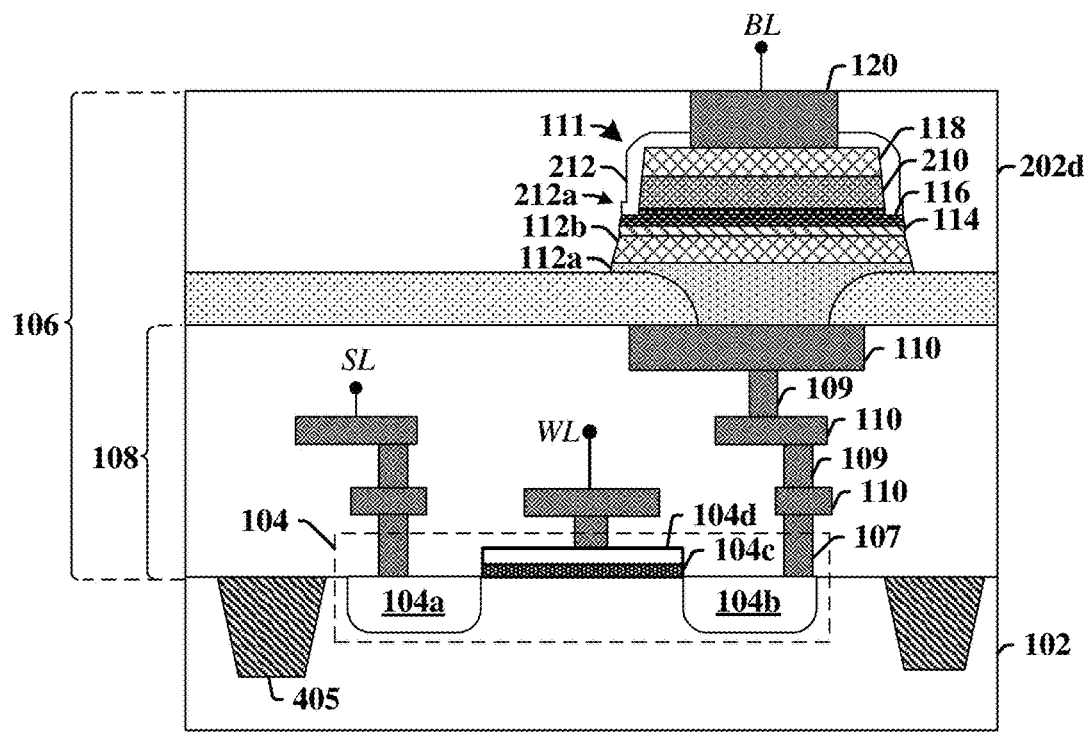
FIGS. 5-6 illustrate cross-sectional views of some additional embodiments of an integrated chip having a disclosed RRAM device comprising a diffusion barrier layer.

FIG. 5 illustrates some additional embodiments of an integrated chip 500 having an RRAM device.

The integrated chip 500 comprises a 1T1R RRAM cell architecture having an access transistor 104 connected to an RRAM device 111. The access transistor 104 is arranged within a substrate 102. In some embodiments, the access transistor 104 may comprise a MOSFET device having a gate electrode 104d that is arranged between a source region 104a and a drain region 104b and that is separated from the substrate by a gate dielectric 104c.

A dielectric structure 106 is arranged over the substrate 102. One or more lower interconnect layers 108 including conductive contacts 107, interconnect vias 109, and interconnect wires 110, are surrounded by the dielectric structure 106. The interconnect wires 110 include a source-line SL comprising a first interconnect wire that is electrically coupled to the source region 104a. In some embodiments, the source-line SL may be arranged in a second interconnect wire layer that is connected to the source region 104a through a conductive contact, a first interconnect wire, and a first interconnect via. The interconnect wires 110 further comprise a word-line WL comprising a second interconnect wire that is electrically coupled to the gate electrode 104d. In some embodiments, the word-line WL may be arranged in the first interconnect wire layer that is connected to the gate electrode 104d by way of a conductive contact.

An RRAM device 111 is arranged over the dielectric structure 106. The RRAM device comprises a bottom electrode 112 separated from a top electrode 118 by a diffusion barrier layer 114, a dielectric data storage layer 116, and a capping layer 210. The bottom electrode 112 is directly connected to the drain region 104b by the one or more lower interconnect layers 108. The top electrode 118 is further coupled to a bit-line BL by way of an upper interconnect structure 120.

In some embodiments, dielectric spacers 212 are arranged along opposing sides of the top electrode 118. In some embodiments, the dielectric spacers 212 may have a horizontally extending segment 212a that protrudes outward from a sidewall of the dielectric spacers 212. In various embodiments, horizontally extending segments may protrude outward from opposing sides of the dielectric spacers 212 or a horizontally extending segment may protrude outward from one side of the dielectric spacers 212 and not from an opposing side of the dielectric spacers 212.

Although integrated chip 500 illustrates the word-line WL, the source-line SL, the bit-line BL, and the RRAM device 111 as being located at certain levels within a BEOL (back-end-of-the-line) stack, it will be appreciated that the position of these elements is not limited to those illustrated positions. Rather, the elements may be at different locations within a BEOL stack. For example, in some alternative embodiments, the RRAM device 111 may be located between a second and third metal interconnect wire.

Figure 6:
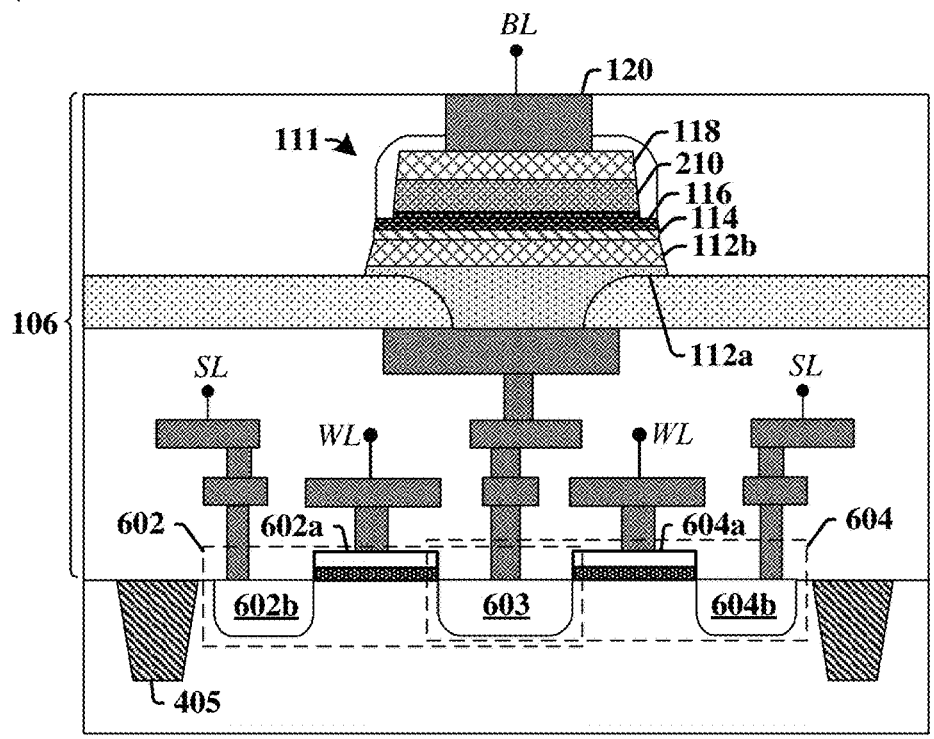

FIG. 6 illustrates some additional embodiments of an integrated chip 600 having an RRAM device.

The integrated chip 600 comprises a 2T1R RRAM cell architecture having a first access transistor 602 and a second access transistor 604 connected in parallel to an RRAM device 111. The first access transistor 602 and the second access transistor 604 are arranged within a substrate 102. In some embodiments, the first access transistor 602 has a first gate electrode 602a that is arranged between a first source region 602b and a common drain region 603. The first source region 602b is coupled to a source-line SL and the first gate electrode 602a is coupled to a word-line WL. The second access transistor 604 has a second gate electrode 604a that is arranged between a second source region 604b and the common drain region 603. The second source region 604b is coupled to the source-line SL and the second gate electrode 604a is coupled to the word-line WL.

One or more lower interconnect layers 108 couple the common drain region 603 to the RRAM device 111 arranged within a dielectric structure 106 over the substrate 102. By coupling the common drain region 603 to the RRAM device 111, a driving current provided to the RRAM device 111 can be increased over RRAM cells that utilize a single access transistor (e.g., as shown in FIG. 5).

FIGS. 7-17 illustrate cross-sectional views 700-1700 of some embodiments of a method of forming an integrated chip having an RRAM cell comprising a diffusion barrier layer disposed between a bottom electrode and a data storage layer. Although FIGS. 7-17 are described in relation to a method, it will be appreciated that the structures disclosed in FIGS. 7-17 are not limited to such a method, but instead may stand alone as structures independent of the method.

Figure 7:
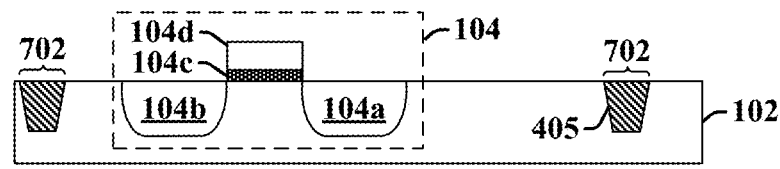
FIGS. 7-17 illustrate cross-sectional views of some embodiments of a method of forming an integrated chip having a disclosed RRAM device comprising a diffusion barrier layer disposed between a bottom electrode and a data storage layer.

As shown in cross-sectional view 700 of FIG. 7, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, one or more isolation structures 405 (e.g., shallow trench isolation structures) may be formed within the substrate 102. The one or more isolation structures 405 may be formed by selectively etching the substrate 102 to form a trench 702 defined by sidewalls of the substrate 102. The trench 702 is subsequently filled with one or more dielectric materials.

An access transistor 104 is formed over the substrate 102. In some embodiments, the access transistor 104 may be formed by forming a gate dielectric over the substrate and forming a gate material over the gate dielectric. The gate dielectric and the gate material may be formed by way of vapor deposition processes (e.g., CVD, PE-CVD, PVD, or ALD). In some embodiments, the gate material may comprise doped polysilicon. In some embodiments, the gate material may comprise a sacrificial gate material that is subsequently replaced with a metal gate material, such as aluminum, cobalt, ruthenium, or the like.

The gate dielectric and the gate material are patterned to define a gate structure having a gate dielectric 104c and a gate electrode 104d over the gate dielectric 104c. In some embodiments, the gate dielectric and the gate material may be selectively patterned according to a masking layer (not shown) formed over the gate material. In some embodiments, the masking layer may comprise a photosensitive material (e.g., photoresist) formed by a spin coating process. In such embodiments, the photosensitive material is selectively exposed to electromagnetic radiation according to a photomask. The electromagnetic radiation modifies a solubility of exposed regions within the photosensitive material to define soluble regions. The photosensitive material is subsequently developed to define openings within the photosensitive material by removing the soluble regions. In other embodiments, the masking layer may comprise a hard mask layer (e.g., a silicon nitride layer, a silicon carbide layer, or the like).

Figure 8:
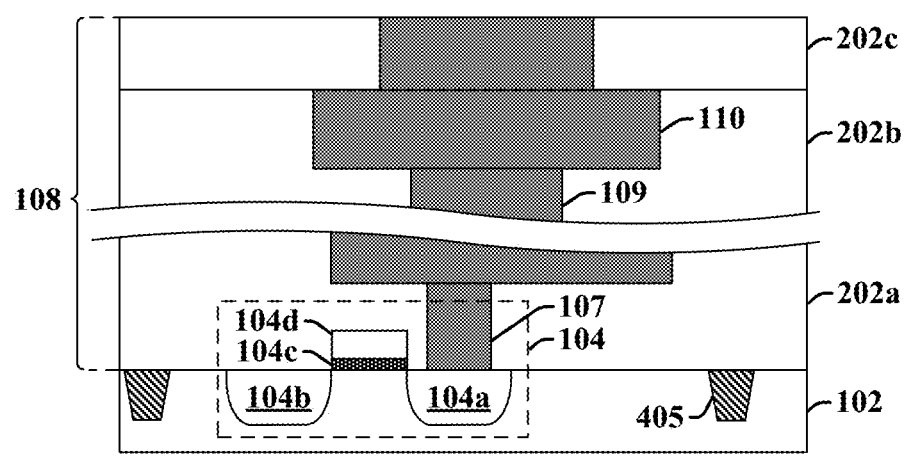

As shown in cross-sectional view 800 of FIG. 8, one or more lower interconnect layers 108 are formed within one or more stacked lower inter-level dielectric (ILD) layers 202a-202c (e.g., an oxide, a low-k dielectric, or an ultra low-k dielectric) over the substrate 102. In some embodiments, the one or more lower interconnect layers 108 may be respectively formed by selectively etching one of the one or more stacked lower ILD layers 202a-202c to define an opening within the ILD layer. A conductive material (e.g., copper, aluminum, etc.) is then deposited to fill the opening, and a planarization process (e.g., a chemical mechanical planarization process) is performed to remove excess conductive material from over the ILD layer.

Figure 9:
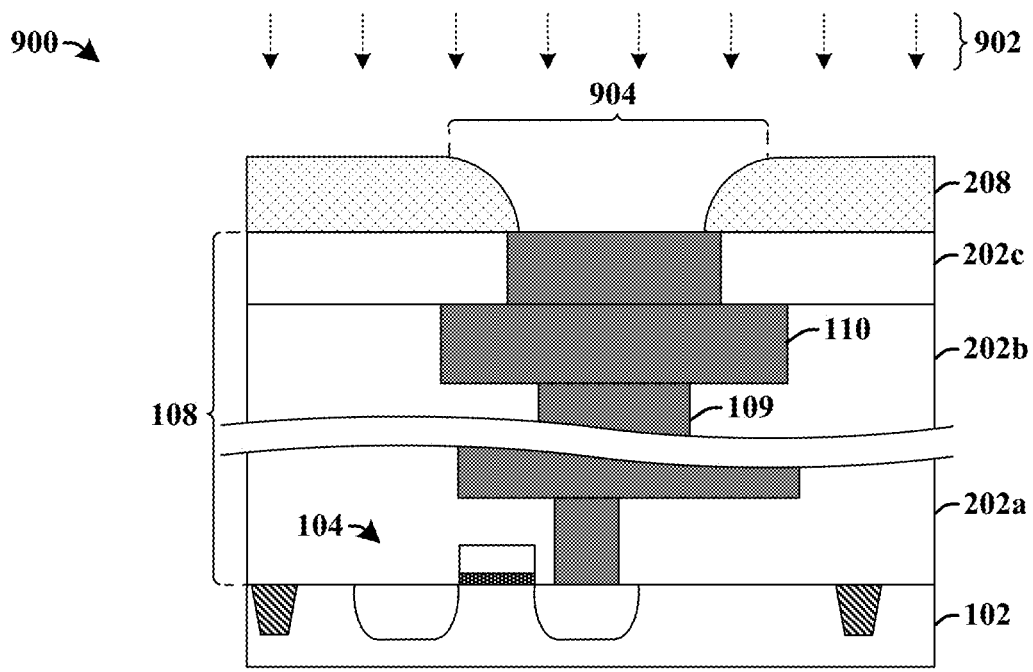

As shown in cross-sectional view 900 of FIG. 9, a lower insulating layer 208 is formed onto the one or more lower interconnect layers 108 and the one or more stacked lower ILD layers 202a-202c. In some embodiments, the lower insulating layer 208 may comprise silicon-nitride (SiN), silicon-carbide (SiC), or a similar composite dielectric film. In some embodiments, the lower insulating layer 208 may be formed by a deposition technique (e.g., physical vapor deposition (PVD), chemical vapor deposition (CVD), PE-CVD, atomic layer deposition (ALD), sputtering, etc.) to a thickness in a range of between approximately 50 Angstroms and approximately 250 Angstroms. After being deposited, the lower insulating layer 208 is selectively exposed to a first etchant 902 (e.g., a dry etchant, a wet etchant) that forms sidewalls defining an opening 904 within the lower insulating layer 208. The opening 904 extends through the lower insulating layer 208 to one of the one or more lower interconnect layers 108. In some embodiments, the lower insulating layer 208 may be selectively exposed to the first etchant 902 according to a masking layer (not shown) formed over the lower insulating layer 208.

Figure 10:
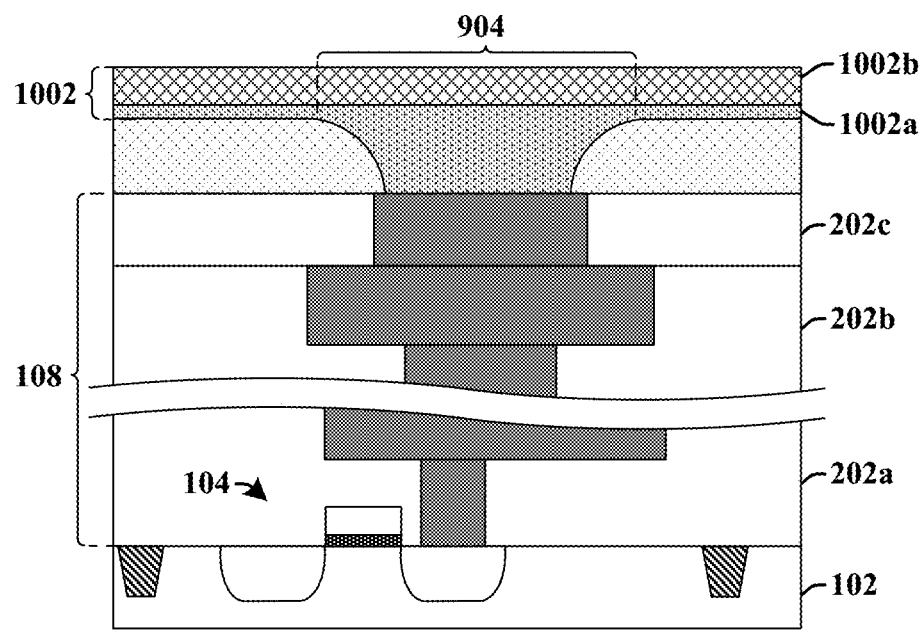

As shown in cross-sectional view 1000 of FIG. 10, a bottom electrode structure 1002 is formed over the one or more lower interconnect layers 108 and the lower insulating layer 208. The bottom electrode structure 1002 extends from within the opening 904 to a position overlying the lower insulating layer 208. In some embodiments, the bottom electrode structure 1002 is formed by performing separate depositions to form a bottom electrode barrier film 1002a and to subsequently form a bottom electrode metal film 1002b over the bottom electrode barrier film 1002a. In some embodiments, the separate depositions may be performed in-situ (e.g., without breaking a vacuum of a processing chamber in which the depositions are performed). In some embodiments, the bottom electrode barrier film 1002a may comprise tantalum nitride (TaN), titanium nitride (TiN), tungsten (W), tungsten nitride (WN), or the like. In some embodiments, the bottom electrode metal film 1002b may comprise a noble metal, such as platinum (Pt), ruthenium (Ru), iridium (Ir), gold (Au), or the like.

Figure 11:
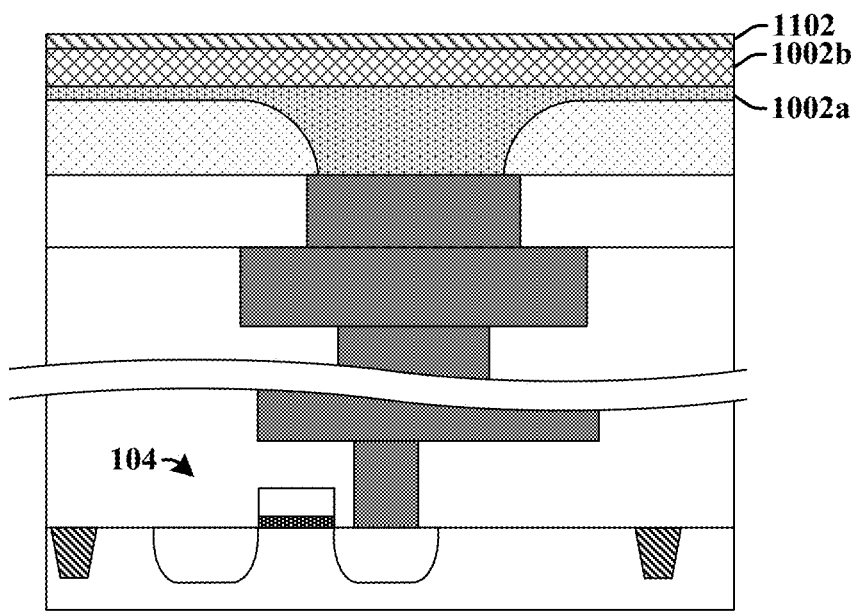

As shown in cross-sectional view 1100 of FIG. 11, a diffusion barrier film 1102 is formed on the bottom electrode structure 1002. The diffusion barrier film 1102 is formed to a thickness in a range of between approximately 5 Angstroms and approximately 30 Angstroms. In some embodiments, the diffusion barrier film 1102 may comprise tantalum nitride (TaN), titanium nitride (TiN), titanium carbon nitride (TiCN), tungsten nitride (WN), or the like. In some additional embodiments, the diffusion barrier film 1102 may comprise a noble metal oxide (e.g., ruthenium oxide, iridium oxide, platinum oxide, palladium oxide, or the like) or a noble metal nitride (e.g., ruthenium nitride, iridium nitride, or the like).

In some embodiments, the diffusion barrier film 1102 may be formed by way of a deposition technique (e.g., PVD, CVD, PE-CVD, ALD, sputtering, etc.). In other embodiments, the diffusion barrier film 1102 may be formed by exposing a noble metal on the bottom electrode 1002 to the oxygen gas (e.g., $O_3$) at an elevated temperature (e.g., a temperature of greater than or equal to approximately 150° C.) to form a noble metal oxide. In yet other embodiments, the diffusion barrier film 1102 may be formed by exposing a noble metal on the bottom electrode 1002 to a nitrogen based plasma (e.g., $N_2O$ plasma) to form a noble metal nitride.

In some embodiments, the diffusion barrier film 1102 may be formed in-situ (i.e., without breaking a vacuum) with the bottom electrode metal film 1002b. In such embodiments, the diffusion barrier film 1102 is formed in direct contact with the bottom electrode metal film 1002b. In other embodiments, the diffusion barrier film 1102 may be formed ex-situ with the bottom electrode metal film 1002b. In such embodiments, an oxide film (e.g., having a thickness of approximately 5 Angstroms or less) may form onto a top of the bottom electrode metal film 1002b. In some such embodiments, the diffusion barrier film 1102 may be separated from the bottom electrode metal film 1002b by the oxide film. In other such embodiments, a hydrofluoric acid dip may be performed prior to the deposition of the diffusion barrier film 1102 to remove the oxide film.

Figure 12:
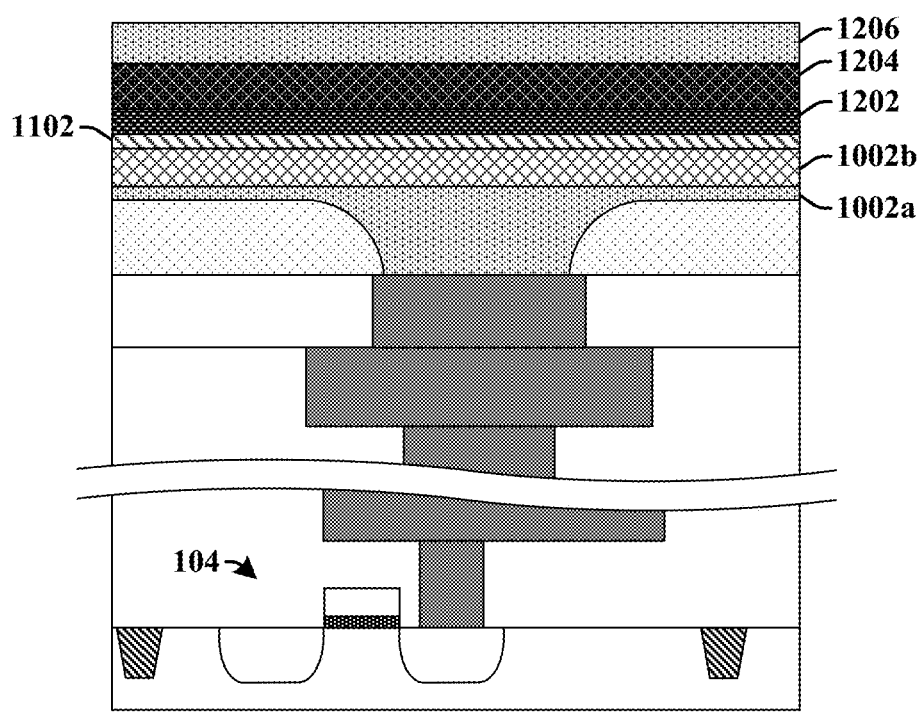

As shown in cross-sectional view 1200 of FIG. 12, a dielectric data storage film 1202 is formed over the diffusion barrier film 1102, a capping film 1204 is formed over the dielectric data storage film 1202, and a top electrode structure 1206 is formed over the capping film 1204. In some embodiments, the dielectric data storage film 1202 may comprise a high-k dielectric material having a variable resistance. For example, in some embodiments, the dielectric data storage film 1202 may comprise hafnium oxide ($HfO_x$), zirconium oxide ($ZrO_x$), aluminum oxide ($AlO_x$), nickel oxide ($NiO_x$), tantalum oxide ($TaO_x$), titanium oxide ($TiO_x$), or the like. In some embodiments, the capping film 1204 may comprise a metal (e.g., such as titanium (Ti), hafnium (Hf), platinum (Pt), aluminum (Al), or the like) or a metal oxide (e.g., such as titanium oxide ($TiO_x$), hafnium oxide ($HfO_x$), zirconium oxide ($ZrO_x$), germanium oxide ($GeO_x$), cesium oxide ($CeO_x$), or the like). In some embodiments, the top electrode structure 1206 may comprise a metal, such as titanium (Ti), tantalum (Ta), or the like.

Figure 13:
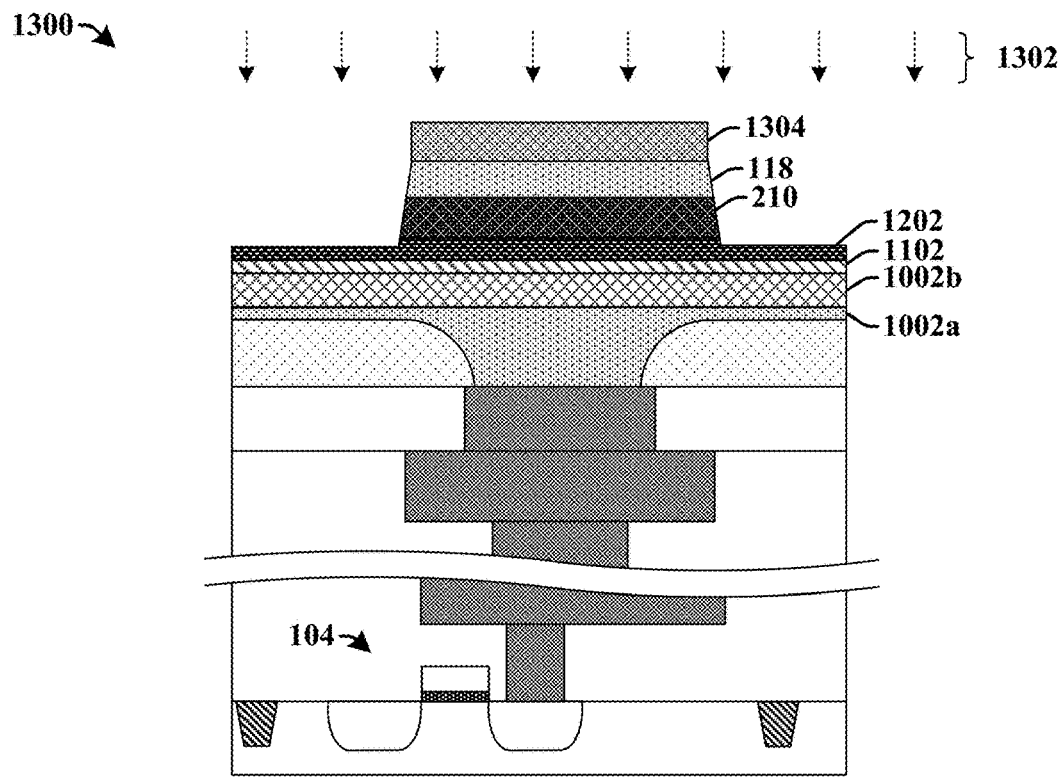

As shown in cross-sectional view 1300 of FIG. 13, a first RRAM patterning process is performed. The first RRAM patterning process selectively patterns the top electrode structure (1206 of FIG. 12) to define a top electrode 118. The first RRAM patterning process may also selectively pattern the capping film (1204 of FIG. 12) to define a capping layer 210. In some embodiments, the first patterning process comprises forming a hard mask layer 1304 over the top electrode structure (1206 of FIG. 12). The top electrode structure is then exposed to a second etchant 1302 (e.g., a dry etchant) according to the hard mask layer 1304 to remove unmasked parts of the capping film (1204 of FIG. 12) and the top electrode structure (1206 of FIG. 12). In various embodiments, the hard mask layer 1304 may comprise silicon-oxide ($SiO_2$), silicon-oxynitride (SiON), silicon-nitride (SiN) silicon-carbide (SiC), or the like.

In some embodiments, the first RRAM patterning process may reduce a thickness of outer regions of the dielectric data storage film 1202, so that the dielectric data storage film 1202 has a central region with a first thickness and outer regions with a second thickness that is less than the first thickness. In some additional embodiments (not shown), the first patterned process may etch through the dielectric data storage film 1202 and into the diffusion barrier film 1102. In such embodiments, the diffusion barrier film 1102 may have a central region with a thickness that is greater than that of outer regions. In some such embodiments, due to different etch selectivities of the diffusion barrier film 1102 and the dielectric data storage film 1202, outermost sidewalls of the dielectric data storage film 1202 may be laterally offset by a non-zero distance from an uppermost sidewall defining the central region of the diffusion barrier film 1102. In some embodiments, the hard mask layer 1304 may be removed after the first RRAM patterning process is completed.

Figure 14:
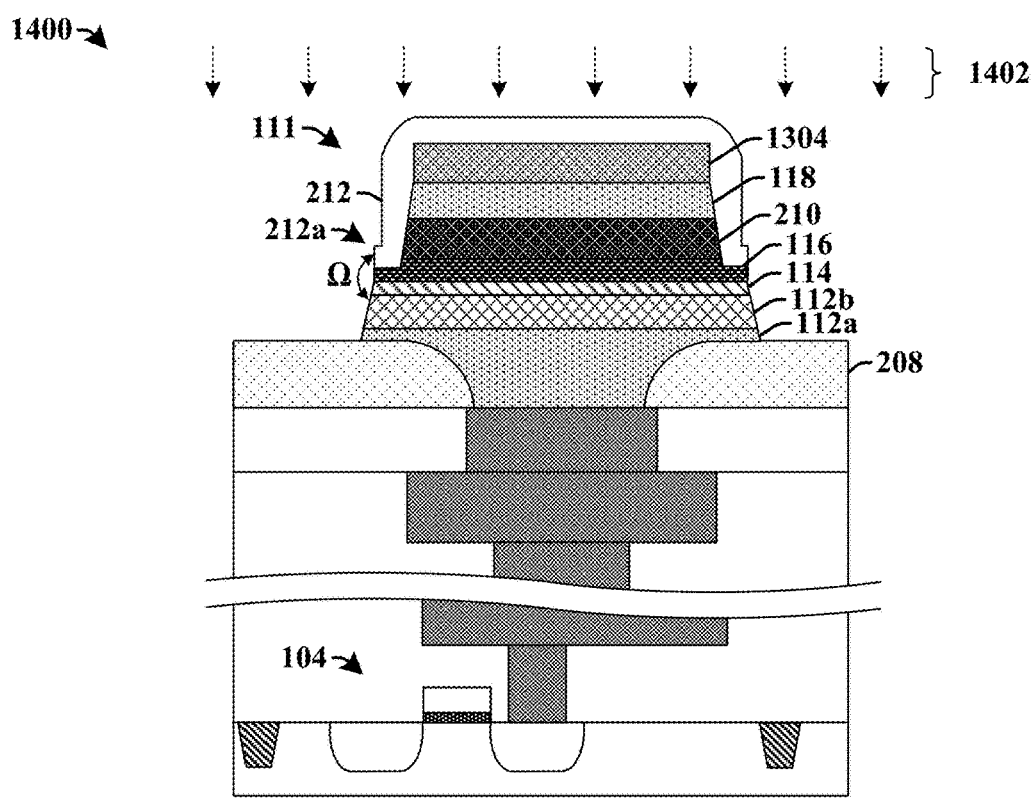

As shown in cross-sectional view 1400 of FIG. 14, in some embodiments, dielectric spacers 212 may be formed on opposing sides of the top electrode 118 and the capping layer 210. The dielectric spacers 212 may also extend over an upper surface of the top electrode 118. In various embodiments, the dielectric spacers 212 may comprise silicon nitride, silicon dioxide ($SiO_2$), silicon oxy-nitride (e.g., SiON), or the like. In some embodiments, the dielectric spacers 212 may have outermost sidewalls that are oriented at an angle $\Omega$ with respect to a sidewall of the diffusion barrier layer 114. In some embodiments, the angle $\Omega$ may be in a range that is between 90° and 180°.

The dielectric spacers 212 may be formed by depositing a spacer layer on the dielectric data storage film (1202 of FIG. 13), the capping layer 210, the top electrode 118, and the hard mask layer 1304. In some embodiments, the spacer layer may be deposited by a deposition technique (e.g., PVD, CVD, PE-CVD, ALD, sputtering, etc.) to a thickness in a range of between approximately 100 angstroms and approximately 500 angstroms. The spacer layer is subsequently patterned (e.g., using a lithography process) to define the dielectric spacers 212 along opposing sides of the top electrode 118 and over the top electrode 118. In some embodiments, wherein the second etchant (1302 of FIG. 13) etches through the dielectric data storage layer 116, the dielectric spacers 212 may contact sidewalls of diffusion barrier layer 114.

In some embodiments, the separate patterning process used to define the dielectric spacers 212 may result the dielectric spacers 212 having a horizontally extending segment 212a that protrudes outward from a sidewall of the dielectric spacers 212. In some embodiments, horizontally extending segments may protrude outward from opposing sides of the dielectric spacers 212, while in other embodiments (not shown) the a horizontally extending segment may protrude outward from one side of the dielectric spacers 212 and not from an opposing side of the dielectric spacers 212.

After formation of the dielectric spacers 212, a second RRAM patterning process is performed. The second RRAM patterning process defines an RRAM device 111 by selectively removing the dielectric data storage film (1202 of FIG. 13), the diffusion barrier film (1102 of FIG. 13), and the bottom electrode structure (1002 of FIG. 13) to respectively define a dielectric data storage layer 116, a diffusion barrier layer 114, and a bottom electrode 112. In some embodiments, the second RRAM patterning process selectively exposes the dielectric data storage film (1202 of FIG. 13), the diffusion barrier film (1102 of FIG. 13), and the bottom electrode structure (1002 of FIG. 13) to a third etchant 1402 according to a mask comprising the dielectric spacers 212.

Figure 15:
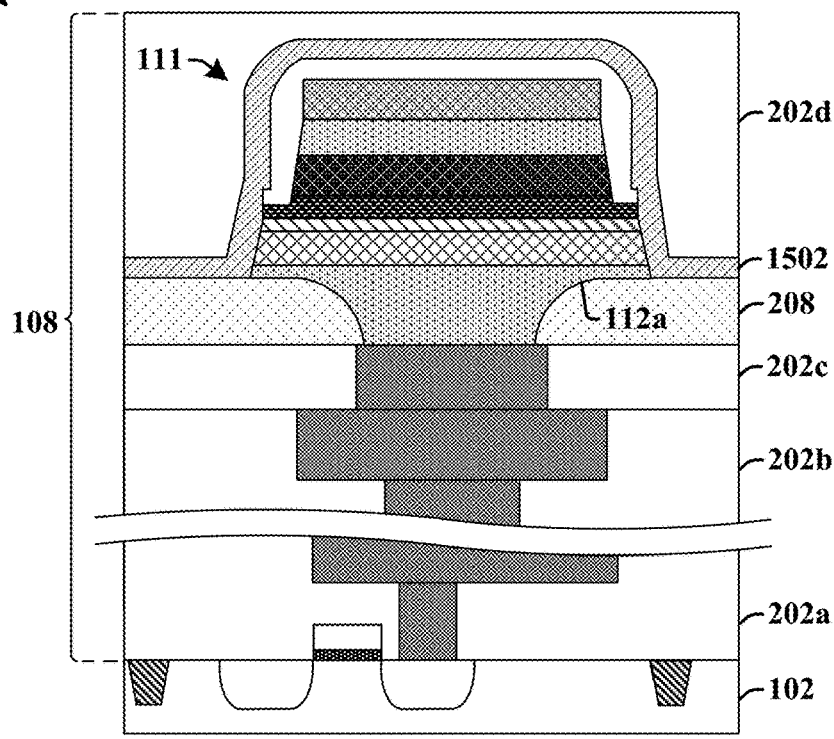

As shown in cross-sectional view 1500 of FIG. 15, an upper insulating layer 1502 may be formed over the RRAM device 111. In various embodiments, the upper insulating layer 1502 may comprise silicon nitride, silicon dioxide ($SiO_2$), silicon oxy-nitride (e.g., SiON), or the like. An upper inter-level dielectric (ILD) layer 202d is subsequently formed over the upper insulating layer 1502. The upper insulating layer 1502 has a first side facing the substrate 102 and a second side that faces the upper ILD layer 202d.

Figure 16:
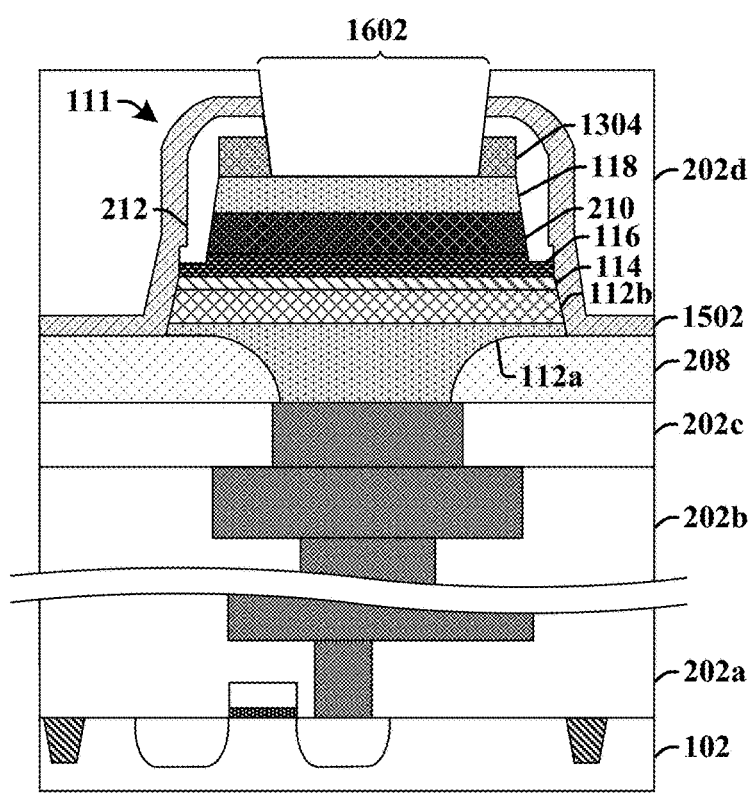

As shown in cross-sectional view 1600 of FIG. 16, the upper ILD layer 202d is selectively patterned to form an opening 1602. The opening 1602 is defined by sidewalls of the upper ILD layer 202d, the upper insulating layer 1502, and the hard mask layer 1304. The opening 1602 vertically extends from a top of the upper ILD layer 202d to the top electrode 118 of the RRAM device 111.

Figure 17:
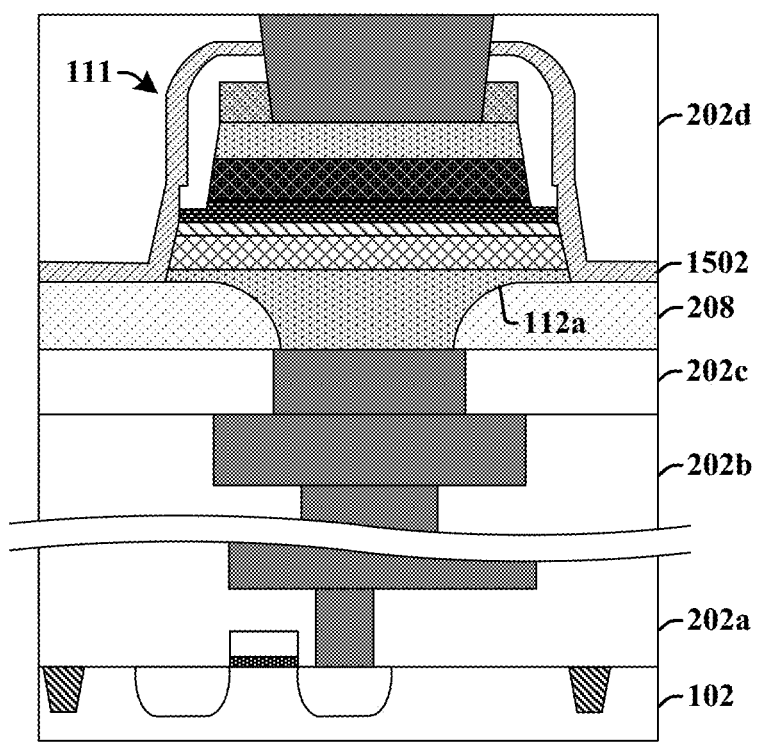

As shown in cross-sectional view 1700 of FIG. 17, an upper interconnect structure 120 is formed within the opening 1602 in the upper ILD layer 202d. In some embodiments, the upper interconnect structure 120 may comprise an upper interconnect wire or via. In some embodiments, the upper interconnect structure 120 may be formed by filling the opening 1602 with a conductive material (e.g., copper and/or aluminum) and subsequently performing a planarization process (e.g., a chemical mechanical planarization process) to remove an excess of the conductive material from over the upper ILD layer 202d.

Figure 18:
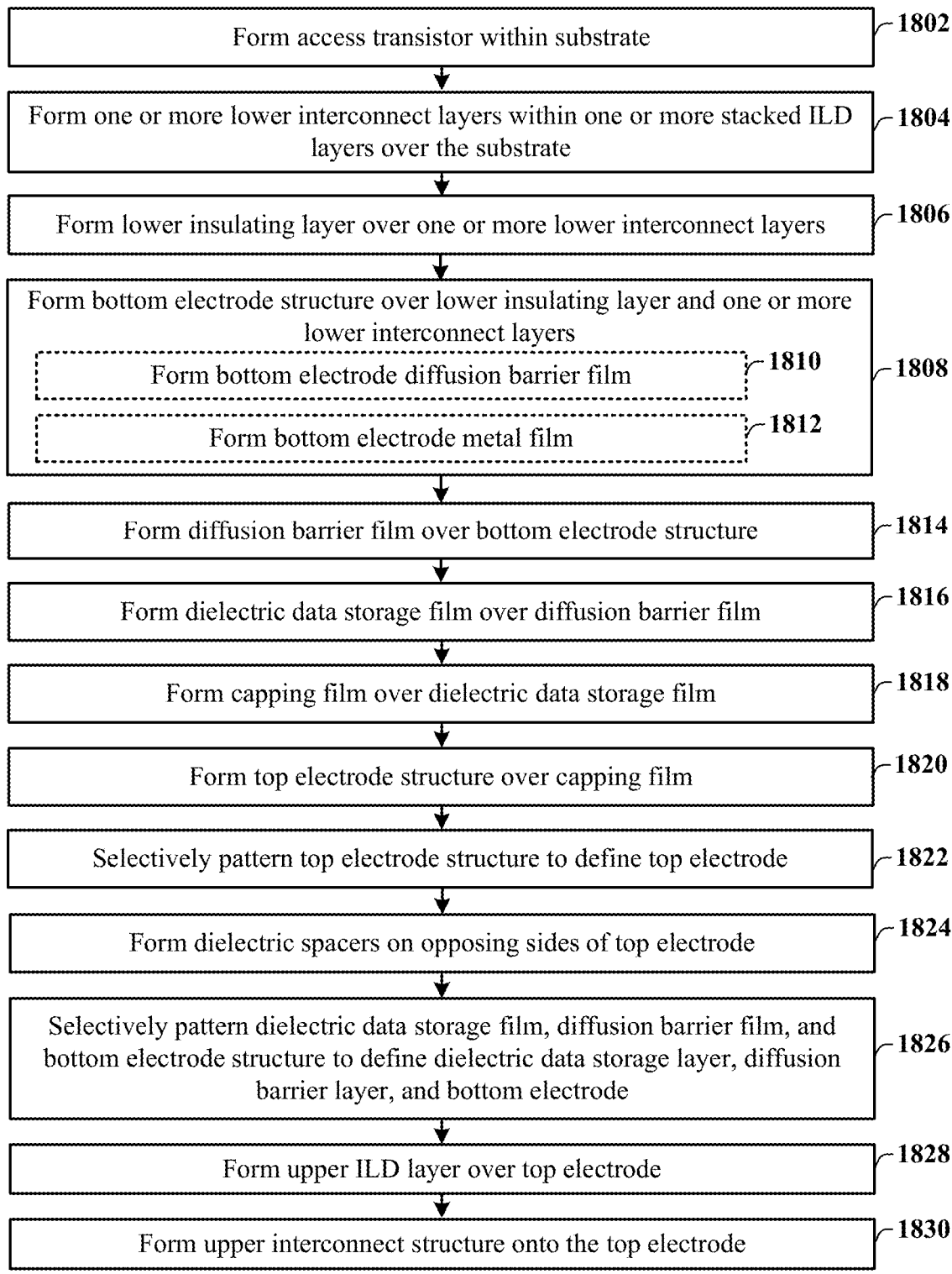
FIG. 18 illustrates a flow diagram of some embodiments of a method of forming an integrated chip having a disclosed RRAM device comprising a diffusion barrier layer disposed between a bottom electrode and a data storage layer.

FIG. 18 illustrates a flow diagram of some embodiments of a method 1800 of forming an integrated chip having an RRAM device.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, an access transistor is formed within a substrate. FIG. 7 illustrates a cross-sectional view 700 of some embodiments corresponding to act 1802.

At 1804, one or more lower interconnect layers are formed within one or more stacked ILD layers over the substrate. FIG. 8 illustrates a cross-sectional view 800 of some embodiments corresponding to act 1804.

At 1806, a lower insulating layer is formed over the one or more lower interconnect layers and the one or more stacked ILD layers. The lower insulating layer comprises an opening that extends through the lower insulating layer to the one or more lower interconnect layers. FIG. 9 illustrates a cross-sectional view 900 of some embodiments corresponding to act 1806.

At 1808, a bottom electrode structure is formed over the lower insulating layer and the one or more lower interconnect layers. FIG. 10 illustrates a cross-sectional view 1000 of some embodiments corresponding to act 1808. In some embodiments, the bottom electrode structure may be formed according to acts 1810-1812. At 1810, a bottom electrode diffusion barrier film is formed over the plurality of lower interconnect layers and the lower insulating layer. At 1812, a bottom electrode metal film is subsequently formed over the bottom electrode diffusion barrier film.

At 1814, a diffusion barrier film is formed over the bottom electrode structure. FIG. 11 illustrates a cross-sectional view 1100 of some embodiments corresponding to act 1814.

At 1816, a dielectric data storage film is formed over the diffusion barrier film. FIG. 12 illustrates a cross-sectional view 1200 of some embodiments corresponding to act 1816.

At 1818, a capping film is formed over the dielectric data storage film in some embodiments. FIG. 12 illustrates a cross-sectional view 1200 of some embodiments corresponding to act 1818.

At 1820, a top electrode structure is formed over the capping film. FIG. 12 illustrates a cross-sectional view 1200 of some embodiments corresponding to act 1820.

At 1822, the top electrode structure is selectively patterned to define top electrode. FIG. 13 illustrates a cross-sectional view 1300 of some embodiments corresponding to act 1822.

At 1824, dielectric spacers are formed on opposing sides of the top electrode. FIG. 14 illustrates a cross-sectional view 1400 of some embodiments corresponding to act 1824.

At 1826, the dielectric data storage film, the diffusion barrier film, and the bottom electrode structure are selectively patterned to define a dielectric data storage layer, a diffusion barrier layer, and a bottom electrode. FIG. 14 illustrates a cross-sectional view 1400 of some embodiments corresponding to act 1826.

At 1828, an upper inter-level dielectric (ILD) layer is deposited over the top electrode. FIG. 15 illustrates a cross-sectional view 1500 of some embodiments corresponding to act 1828.

At 1830, an upper interconnect structure is formed onto the top electrode. FIGS. 16-17 illustrate cross-sectional views 1600-1700 of some embodiments corresponding to act 1830.

Although the disclosed figures and description are described in relation to resistive random access memory (RRAM) devices, it will be appreciated that the disclosed diffusion barrier layer is not limited to such memory devices. Rather, in some alternative embodiments, the disclosed diffusion barrier layer may also be applied to other types of memory devices (e.g., programmable metallization cell memory device, phase change memory device, or the like).

Accordingly, in some embodiments, the present disclosure relates to an integrated chip having an RRAM cell comprising a diffusion barrier layer arranged between a bottom electrode and a dielectric data storage layer. The diffusion barrier layer is configured to prevent the diffusion of metal atoms (e.g., noble metal atoms) from the bottom electrode into the dielectric data storage layer, thereby allowing the dielectric data storage layer to have a substantially uniform thickness that increases reliability of the RRAM device.

In some embodiments, the present disclosure relates to an integrated chip. The integrated chip includes a bottom electrode disposed over one or more interconnect layers; a diffusion barrier layer arranged over the bottom electrode; a data storage layer separated from the bottom electrode by the diffusion barrier layer; and a top electrode arranged over the data storage layer. In some embodiments, the diffusion barrier layer has a bottom surface directly contacting the bottom electrode and a top surface directly contacting the data storage layer. In some embodiments, the diffusion barrier layer includes tantalum nitride, titanium nitride, titanium carbon nitride, or tungsten nitride. In some embodiments, the diffusion barrier layer includes a noble metal oxide or a noble metal nitride. In some embodiments, the bottom electrode includes a bottom electrode diffusion barrier and a bottom electrode metal, and the bottom electrode metal is arranged directly between the diffusion barrier layer and the bottom electrode diffusion barrier. In some embodiments, the bottom electrode metal includes a noble metal. In some embodiments, the top electrode and the bottom electrode diffusion barrier include a same material. In some embodiments, the integrated chip further includes an insulating layer arranged over one or more stacked inter-level dielectric (ILD) layers overlying the substrate, the bottom electrode diffusion barrier having a curved lower sidewall surrounded by the insulating layer and a substantially flat upper sidewall over the insulating layer. In some embodiments, the diffusion barrier layer has a thickness in a range of between approximately 5 Angstroms and approximately 30 Angstroms. In some embodiments, the diffusion barrier layer has a maximum width that is larger than a width of a top surface of the data storage layer.

In other embodiments, the present disclosure relates to an integrated chip. The integrated chip includes one or more interconnect layers arranged within one or more stacked inter-level dielectric (ILD) layers over a substrate; a bottom electrode diffusion barrier laterally surrounded by an insulating layer disposed over the one or more stacked ILD layers; a bottom electrode metal having a bottom surface contacting the bottom electrode diffusion barrier, the bottom electrode metal including a noble metal; a diffusion barrier layer contacting a top surface of the bottom electrode metal; a dielectric data storage layer contacting the diffusion barrier layer; and a top electrode separated from the bottom electrode metal by the dielectric data storage layer and the diffusion barrier layer. In some embodiments, the top electrode and the bottom electrode diffusion barrier comprise a first material that is different from a second material of the bottom electrode metal. In some embodiments, the top electrode and the bottom electrode diffusion barrier include titanium nitride, tantalum nitride, tungsten, or tungsten nitride. In some embodiments, the diffusion barrier layer has an inner region surrounded by an outer region, the inner region having a recessed upper surface arranged laterally between and vertically below upper surfaces of the outer region. In some embodiments, the diffusion barrier layer has a substantially equal thickness between outermost sidewalls. In some embodiments, the integrated chip further includes dielectric spacers arranged along sidewalls of the top electrode, the dielectric spacers having a horizontally extending segment that protrudes outward from a sidewall of the dielectric spacers.

In yet other embodiments, the present disclosure relates to a method of forming an integrated chip. The method includes forming a bottom electrode structure over one or more interconnect layers, the one or more interconnect layers disposed within one or more stacked inter-level dielectric (ILD) layers over a substrate; forming a diffusion barrier film over the bottom electrode structure; forming a dielectric data storage film onto the diffusion barrier film; forming a top electrode structure over the dielectric data storage film; and patterning the top electrode structure, the dielectric data storage film, the diffusion barrier film, and the bottom electrode structure to define a memory device. In some embodiments, the method further includes forming the diffusion barrier film to a thickness that prevents formation of hillocks including noble metal atoms from the bottom electrode structure from extending into the dielectric data storage film. In some embodiments, forming the bottom electrode structure includes forming a bottom electrode diffusion barrier film over the one or more interconnect layers; and forming a bottom electrode metal film in contact with a top surface of the bottom electrode diffusion barrier film. In some embodiments, the method further includes forming the diffusion barrier film in contact an upper surface of the bottom electrode metal film; and forming the dielectric data storage film in contact with an upper surface of the diffusion barrier film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a bottom electrode diffusion barrier disposed within a lower insulating layer and over one or more interconnect layers, wherein the bottom electrode diffusion barrier continuously extends from directly between sidewalls of the lower insulating layer to over a top of the lower insulating layer;
   a bottom electrode metal arranged over the bottom electrode diffusion barrier;
   a diffusion barrier layer arranged over the bottom electrode metal;
   a data storage layer separated from the bottom electrode metal by the diffusion barrier layer;
   an oxide disposed between the bottom electrode metal and the diffusion barrier layer; and
   a top electrode arranged over the data storage layer.

2. The integrated chip of claim 1, wherein the diffusion barrier layer has a bottom surface directly contacting the bottom electrode metal and a top surface directly contacting the data storage layer.

3. The integrated chip of claim 1, wherein the diffusion barrier layer comprises tantalum nitride, titanium nitride, titanium carbon nitride, or tungsten nitride.

4. The integrated chip of claim 1, wherein the diffusion barrier layer comprises a noble metal oxide or a noble metal nitride.

5. The integrated chip of claim 1, wherein the bottom electrode metal comprises a noble metal.

6. The integrated chip of claim 1, wherein the top electrode and the bottom electrode diffusion barrier comprise a same material.

7. The integrated chip of claim 1, wherein the bottom electrode diffusion barrier has a curved lower sidewall surrounded by the lower insulating layer and a substantially flat upper sidewall over the lower insulating layer.

8. The integrated chip of claim 1, wherein the diffusion barrier layer has a thickness in a range of between approximately 5 Angstroms and approximately 30 Angstroms.

9. The integrated chip of claim 1, wherein the diffusion barrier layer has a maximum width that is larger than a width of a top surface of the data storage layer.

10. An integrated chip, comprising:
    one or more interconnect layers arranged within one or more stacked inter-level dielectric (ILD) layers over a substrate;
    a bottom electrode diffusion barrier extending above and laterally surrounded by an insulating layer disposed over the one or more stacked ILD layers;
    a bottom electrode metal having a bottom surface contacting the bottom electrode diffusion barrier, wherein the bottom electrode metal comprises a noble metal;
    a diffusion barrier layer contacting a top surface of the bottom electrode metal, wherein the diffusion barrier layer has an inner region surrounded by an outer region, the inner region having a recessed upper surface arranged laterally between and vertically below upper surfaces of the outer region;
    a dielectric data storage layer contacting the diffusion barrier layer; and
    a top electrode separated from the bottom electrode metal by the dielectric data storage layer and the diffusion barrier layer.

11. The integrated chip of claim 10, wherein the top electrode and the bottom electrode diffusion barrier comprise a first material that is different from a second material of the bottom electrode metal.

12. The integrated chip of claim 10, wherein the top electrode and the bottom electrode diffusion barrier comprise titanium nitride, tantalum nitride, tungsten, or tungsten nitride.

13. The integrated chip of claim 10, wherein the diffusion barrier layer has a substantially equal thickness between outermost sidewalls.

14. The integrated chip of claim 10, further comprising:
    dielectric spacers arranged along sidewalls of the top electrode, wherein the dielectric spacers have a horizontally extending segment that protrudes outward from a sidewall of the dielectric spacers.

15. An integrated chip, comprising:
    a bottom electrode comprising a noble metal disposed over one or more interconnect layers;
    a lower insulating layer disposed over the one or more interconnect layers, wherein the bottom electrode extends from directly between sidewalls of the lower insulating layer to over an upper surface of the lower insulating layer;
    a diffusion barrier layer contacting a top of the bottom electrode along an interface over the upper surface of the lower insulating layer, wherein the diffusion barrier layer has an inner region surrounded by an outer region, the inner region having a recessed upper surface arranged laterally between and vertically below upper surfaces of the outer region;
    a data storage layer separated from the bottom electrode by the diffusion barrier layer, wherein the diffusion barrier layer is configured to prevent out diffusion of atoms from the bottom electrode towards the data storage layer; and a top electrode arranged over the data storage layer.

16. The integrated chip of claim 15, wherein the diffusion barrier layer has a first width that is substantially equal to a second width of the bottom electrode.

17. The integrated chip of claim 15, further comprising:

an oxide disposed between the bottom electrode and the diffusion barrier layer.

18. The integrated chip of claim 17, wherein the diffusion barrier layer comprises a same material as the bottom electrode.

19. The integrated chip of claim 1, wherein the top electrode and the bottom electrode diffusion barrier comprise titanium nitride, tantalum nitride, tungsten, or tungsten nitride.

20. The integrated chip of claim 1, wherein the bottom electrode metal comprises a noble metal.

* * * * *